United States Patent [19]

Lauterbach

[11] 4,395,727

[45] Jul. 26, 1983

[54] BARRIER-FREE, LOW-RESISTANT ELECTRICAL CONTACT ON III-V SEMICONDUCTOR MATERIAL

[75] Inventor: Christl Lauterbach, Ottobrunn, Fed. Rep. of Germany

[73] Assignee: Siemens Aktiengesellschaft, Berlin & Munich, Fed. Rep. of Germany

[21] Appl. No.: 244,723

[22] Filed: Mar. 17, 1981

[30] Foreign Application Priority Data

Mar. 27, 1980 [DE] Fed. Rep. of Germany ....... 3011952

[51] Int. Cl.³ .................... H01L 23/48; H01L 23/54; H01L 29/40; H01L 29/54
[52] U.S. Cl. ...................................... 357/71; 357/65; 357/68
[58] Field of Search ............... 357/68, 71, 16; 427/89, 427/65

[56] References Cited

U.S. PATENT DOCUMENTS

4,017,332  4/1977  James .................................. 357/16

OTHER PUBLICATIONS

"Evaporation Shielding for Continuous PbIn Deposition", Brunner, *IBM Technical Disclosure Bulletin*, vol. 19, No. 7, Dec. 1976, pp. 2496-2498.

"Ideal Ohmic Contacts to InP", Mills and Hartnagel, *Electronics Letters*, vol. 11, No. 25/26, pp. 621-622, Dec. 11, 1975, Institution of Electrical Engineers, London.

"Evaporation of Lead-Indium as Contacts for Semiconductor Chips", H. M. Dalal et al., *IBM Technical Disclosure Bulletin*, vol. 19, No. 5, Oct. 1976, p. 1677.

*Primary Examiner*—Andrew J. James
*Assistant Examiner*—E. D. Burnside
*Attorney, Agent, or Firm*—Hill, Van Santen, Steadman, Chiara & Simpson

[57] ABSTRACT

A contact structure on indium-containing III-V semiconductor material is comprised of a four layer sequence consisting of an indium layer in direct contact with the semiconductor material, a zinc layer in contact with the indium layer, a chromium-nickel or chromium or palladium or platinum layer in contact with the zinc layer and a gold layer for external contacting with a lead. An exemplary embodiment of such contact structure exhibits specific contact resistance ranging between about $10^{-4}$ and $10^{-5}$ ohm · cm².

10 Claims, 1 Drawing Figure

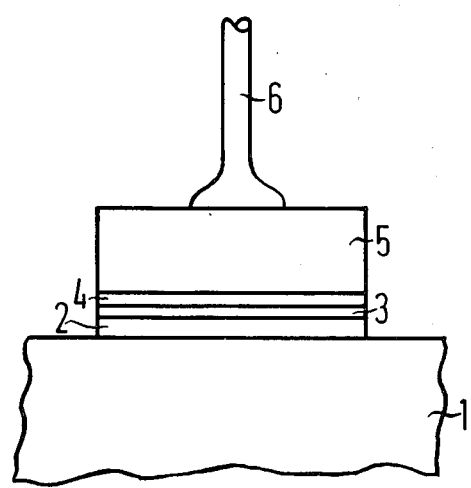

BARRIER-FREE, LOW-RESISTANT ELECTRICAL CONTACT ON III-V SEMICONDUCTOR MATERIAL

BACKGROUND OF THE INVENTION

The invention relates to a barrier-free, low-resistance electrical contact and somewhat more particularly to a multilayered ohmic contact of this type for semiconductor components having indium-containing III-V semiconductor materials.

PRIOR ART

Indium-containing III-V based semiconductors, such as for example, indium-gallium-arsenide, indium-gallium-phosphide or indium-gallium-arsenide-phosphide, require electrical contacts having properties which are presently attainable only with considerable difficulties. Reproducible contacts having a low specific contact resistance ranging between $10^{-4}$ to $10^{-5}$ ohm cm$^2$ are required and the current-voltage characteristics of such contacts should exhibit ohmic behaviour over a wide voltage range.

Ohmic contacts for p-conductive indium-containing III-V semiconductor materials are known [see G. Weimann and W. Schlopp, "Ohmic Contacts on Indium Phosphite", *Phys. Stat. Sol.*, Vol. (a) 50, (1978) pages K 219-K 223]. To a large extent, such contacts have been manufactured by vapor-deposition of various metal layer sequences. For example, contacts comprised of two layers, such as of chromium and gold, of zinc and gold as well as of silver and gold are known. A layer structure consisting basically of three layers is also known in the prior art. In this arrangement, the first layer on the semiconductor material is indium, the second layer is zinc and the third layer consists of silver and gold, with a relatively thick silver layer component and a relatively thin gold layer component, which guarantees a qualitatively better contact than silver.

Contacts consisting of such layers have been manufactured whereby an alloying-in process has been carried out in neutral or a reducing atmosphere. Particularly with semiconductor materials having a relatively low amount of dopant therein, the quality of such contacts greatly depends on the pre-treatment of the semiconductor surface and is barely reproducible, even within the framework of practically identical surface treatments. The same problem occurs over and over in the various contact systems. First, the alloying-in time period is too long for a barrier-free, low-resistant contact which leads to strong edge disturbances on a contact so-produced. Such a contact cannot be employed, particularly for those instances where the current feed into the semiconductor material must be homogeneous, for example, in luminescent diodes with a high radial intensity per unit area. However, the alloying-in period can be shortened by increasing the alloying-in temperature. However, in this instance, the alloying front penetrates too deeply into the semiconductor material and causes problems, particularly with thin expitaxial layers functioning as the semiconductor material. Particularly with a multi-layer epitaxial format, alloy front penetration leads to short-circuits with those epitaxial layers of the format which are situated deeper within the semiconductor component. Further, it has proven difficult to simply produce bondable contacts in the known manner because the contact material, for example, gold, after the alloying-in process exhibits at its surface admixtures of components of the semiconductor material and, under certain conditions, of additional materials in the contact layer sequence.

SUMMARY OF THE INVENTION

The invention provides a barrier-free, low-resistant ohmic contact for indium-containing III-V semiconductor materials which substantially eliminates the above prior art disadvantages.

In accordance with the principles of the invention, a barrier-free low-resistance electrical contact for a semiconductor component based on indium-containing III-V semiconductor material is composed of a plurality of layers positioned one on top of another in a layer sequence, with a first layer on the semiconductor material consisting of indium, a second layer consisting of a material having a p-doping effect in the indium-containing III-V semiconductor material and with an uppermost metal layer available for external connection and with all layers applied on one another being subjected to a common thermal treatment wherein in the layer sequence between the second layer and the uppermost layer, includes a third layer consisting of a material selected from the group consisting of platinum, palladium, chromium and a chromium-nickel alloy.

In certain embodiments of the invention, the indium of the first layer is vapor-deposited, preferably in a thickness ranging from about 20 to 50 nm.

In certain embodiments of the invention, the p-doping material of the second layer is selected from the group consisting of zinc, beryllium and cadmium and is preferably applied in a thickness ranging from about 10 to 30 nm.

In certain embodiments of the invention, the third layer is composed of a nickel-chromium alloy having a composition which with crucible evaporation is obtained from a nickel-50-chromium-50 alloy and is preferably applied in a thickness ranging from about 5 to 20 nm.

In certain embodiments of the invention, the uppermost layer is composed of gold and is preferably applied in a thickness ranging from about 300 to 600 nm.

In certain embodiments of the invention, the thermal treatment to which all layers are subjected to (alloying-in) comprises heating the layer sequence to a temperature ranging between about 350° to 450° C. for a time period ranging between about 40 to 90 seconds.

In accordance with the principles of the invention, indium is utilized as the first layer on an indium-containing semi-conductor material. At this location, indium has the affect of etching the semiconductor material and of breaking-up any oxide and/or hydroxide layers situated on the semiconductor surface. Indium as the first layer on the semiconductor material promotes a good adhesion of the contact structure and guarantees a uniform difusion-in of the doping material of the second layer.

In accordance with the principles of the invention, the second layer is composed of a p-doping material such as, for example, zinc, berrylium or cadmium. A relatively thin, highly doped transition layer which provides a barrier-free and low-resistance contact can be generated with such material in the semiconductor in the area of the intended contact by means of the alloying-in process.

In accordance with the principles of the invention, the third layer is composed of platinum, palladium or preferably, a chromium nickel alloy or chromium. These metals guarantee that during the subsequent alloying-in process, no materials of the outer or uppermost contact layer, such as, for example, gold, diffuses or penetrates into the semiconductor material and that no semiconductor material diffuses or penetrates into the gold layer. Without this inventively selected third layer, even with relatively short alloying-in times and relatively low alloying-in temperatures, the contact materials would alloy with one another to a considerable degree and would penetrate relatively deeply into the semiconductor material.

BRIEF DESCRIPTION OF DRAWING

The single FIGURE is an elevated fragmentary and somewhat schematic view of a contact structure produced in accordance with the principles of the invention.

DESCRIPTION OF PREFERRED EMBODIMENTS

An exemplary embodiment of a contact structure produced in accordance with the principles of the invention is comprised of a p-conductivity III-V semiconductor material, such as indium-phosphide or indium-gallium-arsenide phosphide having a p-doping of about $10^{18}$ particles $\cdot cm^{-3}$. Such a semiconductor material 1 is, for example, a 1 to 2 μm thick epitaxial layer on a suitable substrate (not shown). First, a 30 nm thick layer 2 of indium is vapor deposited onto a select area of the semiconductor material 1 via a suitable mask. Next, a 20 nm thick layer 3 of, for example, zinc is similarly applied onto layer 2. Thereafter, a 10 nm thick layer 4 of, for example, a chromium-nickel alloy is applied onto layer 3. Next, an uppermost layer 5 of gold is applied in a thickness of about 500 nm. Layer 5 provides a fault-free external contact terminal for a wire 6 to be bonded thereon. This layer sequence on the semiconductor material is then subjected to a thermal treatment to attain the desired alloying-in.

As explained earlier, layer 4, which functions as a blocking layer, is preferably composed of a chromium-nickel alloy. Such layer is preferably generated by vapor-deposition from a crucible containing a chromium-nickel alloy having approximately 50% nickel and 50% chromium therein. The differing evaporation properties of these metals cause a layer 4 formed therefrom on layer 3 to contain about 4 parts chromium and about 1 part nickel. Such alloy layer provides the required properties for the inventive contacts.

The four layer sequence, layers 2, 3, 4 and 5, in the inventive contact structure described above are then subjected to a thermal treatment, either on the semiconductor material or together with the semiconductor material. During this thermal treatment, the aforementioned alloying-in of at least some of the material of the second layer 3 into the semiconductor material 1 occurs. This doping of the semiconductor material 1, resulting from layer 3 through layer 2, provides the contact structure with specific contact resistance ranging between about $10^{-4}$ and $10^{-5}$ ohm $\cdot cm^2$, with a relatively shallow alloying-in depth of less than about 0.2 μm. In the exemplary embodiment described above, an alloying-in temperature of about 390° C. is recommended, with an alloying-in time period of about 60 seconds.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. A barrier-free, low-resistance contact structure for semiconductor components based on indium-containing III-V semiconductor material, comprising:
    a plurality of layers positioned on one another in a layer sequence on a select area of said semiconductor component,
    with a first layer of said sequence being in direct contact with said semiconductor material and consisting of indium;
    with a second layer of said sequence being in direct contact with said first layer and being composed of a material having a p-doping effect in said semiconductor material;
    with an uppermost layer of said sequence being composed of a metal available for external contact of said semiconductor component;
    said layer sequence being subjected to a common thermal treatment; and
    with a third layer being positioned in the layer sequence between said second layer and said uppermost layer, said third layer being composed of a material selected from the group consisting of platinum, palladium, chromium and a chromium-nickel alloy.

2. A contact structure as defined in claim 1 wherein the indium of said first layer is vapor-deposited.

3. A contact structure as defined in claim 2 wherein the indium layer is deposited in a thickness ranging from about 20 through 50 nm.

4. A contact structure as defined in claim 1 wherein the p-doping material forming said second layer is selected from the group consisting of zinc, beryllium and cadmium.

5. A contact structure as defined in claim 4 wherein said second layer is applied in a thickness ranging between about 10 through 30 nm.

6. A contact structure as defined in claim 1 wherein said third layer is composed of a chromium-nickel alloy having a composition which, with crucible evaporation is obtained from a nickel-50-chromium-50 alloy.

7. A contact structure as defined in claim 6 wherein the thickness of said third layer is in a range of about 5 through 20 nm.

8. A contact structure as defined in claim 1 wherein said uppermost layer is gold and is applied in a thickness ranging from about 300 to 600 nm.

9. A contact structure as defined in claim 1 wherein said first layer consists of approximately 30 nm vapor-deposited indium, said second layer consists of approximately 20 nm zinc said third layer consists of approximately 10 nm chromium-nickel alloy and said uppermost layer consists of 500 nm vapor-deposited gold.

10. A contact structure as defined in claim 1 wherein said common thermal treatment comprises heating said layer sequence to a temperature ranging between about 350° C. and 450° C. over a time duration ranging between about 40 through 90 seconds.

* * * * *